United States Patent [19]
Irrinki et al.

[11] Patent Number: 5,982,659
[45] Date of Patent: Nov. 9, 1999

[54] MEMORY CELL CAPABLE OF STORING MORE THAN TWO LOGIC STATES BY USING DIFFERENT VIA RESISTANCES

[75] Inventors: V. Swamy Irrinki, Milpitas; Thomas R. Wik, Livermore; Raymond T. Leung; Ashok Kapoor, both of Palo Alto; Alex Owens, Los Gatos, all of Calif.

[73] Assignee: LSI Logic Corporation, Milpitas, Calif.

[21] Appl. No.: 08/779,998

[22] Filed: Dec. 23, 1996

[51] Int. Cl.[6] ........................................ G11C 11/56
[52] U.S. Cl. .......................... 365/168; 365/100; 365/105
[58] Field of Search .............................. 365/168, 185.03, 365/100, 105, 175, 148

[56] References Cited

U.S. PATENT DOCUMENTS

| | | | |
|---|---|---|---|
| 4,057,788 | 11/1977 | Sage | 365/174 |
| 4,575,819 | 3/1986 | Amin | 365/104 |
| 4,598,386 | 7/1986 | Roesner | 365/105 |
| 4,633,438 | 12/1986 | Kume et al. | 365/51 |
| 4,661,929 | 4/1987 | Aoki et al. | 365/149 |
| 4,715,014 | 12/1987 | Tuvell et al. | 365/187 |
| 4,910,709 | 3/1990 | Dhong et al. | 365/149 |
| 4,935,896 | 6/1990 | Matsumura et al. | 365/187 |
| 5,021,999 | 6/1991 | Kohda et al. | 365/168 |
| 5,119,330 | 6/1992 | Tanagawa | 365/168 |
| 5,128,894 | 7/1992 | Lin | 365/175 |
| 5,159,570 | 10/1992 | Mitchell et al. | 365/182 |
| 5,172,338 | 12/1992 | Mehrotra et al. | 365/201 |
| 5,280,445 | 1/1994 | Shieh | 365/175 |
| 5,282,162 | 1/1994 | Ochii | 365/189.01 |
| 5,283,761 | 2/1994 | Gillingham | 365/189.07 |
| 5,351,210 | 9/1994 | Saito | 365/210 |
| 5,357,464 | 10/1994 | Shukuri et al. | 365/189.01 |
| 5,392,252 | 2/1995 | Rimpo . | |
| 5,394,362 | 2/1995 | Banks | 365/189.01 |
| 5,459,686 | 10/1995 | Saito | 365/149 |
| 5,521,865 | 5/1996 | Ohuchi et al. | 365/185.22 |
| 5,532,955 | 7/1996 | Gillingham | 365/149 |
| 5,563,836 | 10/1996 | Saito | 365/189.07 |

OTHER PUBLICATIONS

Abbott, et al., "A 4K MOS Dynamic Random–Access Memory," IEEE Journal of Solid–State Circuits, vol. SC–8, No. 5, Oct. 1973, pp. 292–298.

*Primary Examiner*—A. Zarabian
*Attorney, Agent, or Firm*—Conley, Rose & Tayon, PC; B. Noel Kivlin

[57] ABSTRACT

A process which enables storage of more than two logic states in a memory cell. In one embodiment, a via is used to couple a diode between a word read line and a data read line. The via has a resistance which is set to one of a plurality of values at the time of manufacture. When the word read line is asserted, the voltage drop sustained across the via is indicative of the stored logic state. An analog-to-digital (A/D) converter is coupled to the data read line so as to sense the voltage drop and determine the state represented. Since the additional logic states may be used to represent additional information bits, this memory circuit increases the number of bits that may be stored per memory cell, thereby increasing the storage density and reducing the cost per bit.

19 Claims, 6 Drawing Sheets

(c)

303

(d)

303

450

MEMORY CELL CAPABLE OF STORING MORE THAN TWO LOGIC STATES BY USING DIFFERENT VIA RESISTANCES

BACKGROUND OF THE INVENTION

1. Field of the Invention

This invention relates to the field of solid state devices for information storage, and in particular to a method and structure for storing multilevel logic values in a read-only memory.

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage element is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all the cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (written) by setting the state of a flip-flop, it will be retained as long as power is connected to the cell (and flip-flop is not reset by another write signal). RAMs fabricated with such cells are known as static RAMs, or SRAMs. Volatile RAMs can be treated as non-volatile if they are provided with a battery backup. Some DRAM and SRAM chips are even packaged together with a battery to facilitate implementation of this approach.

It is often desirable to use memory devices that will retain information even when the power is interrupted. Magnetic media offer such nonvolatile-memory storage. In addition, a variety of semiconductor memories have been developed with this characteristic. At present, virtually all such non-volatile memories are ROMs. While data can be entered into these memories, the programming procedure varies from one type of ROM to the other.

The first group of nonvolatile memories consists of those ROMs in which data is entered during manufacturing, and cannot be subsequently altered by the user. These devices are known as masked ROMs (or simply ROMs). The next category consists of memories whose data can be entered by the user (user-programmable ROMs). In the first example of this type, known as a programmable ROM, or PROM, data can be entered into the device only once. In the remaining ROM types, data can be erased as well as entered. In one class of erasable ROMs, the cells must be exposed to a strong ultraviolet light in order for the data to be erased. These ROMs are called erasable-programmable ROMs, or EPROMs. In the final type, data can be electrically erased as well as entered into the device; these are referred to as EEPROMs. The time needed to enter data into both EPROMs and EEPROMs is much longer than the time required for the write operation in a RAM. As a result, none of the ROM types can at present be classified as fully functional RAM devices.

Many variations on the basic memory organization architecture have been developed, including video RAMs and multiport RAMs. Architectures which combine memory and logic circuits on the same chip are becoming increasingly popular. But the primary trends in semiconductor memory development are to increase the storage density and to reduce the cost per bit. It would therefore be desirable to have a method and structure for further increasing the bit storage density and reducing the cost per bit.

SUMMARY OF THE INVENTION

The problems outlined above are in large part solved by a circuit and process which enables storage of more than two logic states in a memory cell by varying the resistance of a via in accordance with the present invention. In one embodiment, a memory circuit is provided wherein a via is used to couple a diode between a word read line and a data read line. The via has a resistance which is set to one of a plurality of values at the time of manufacture, wherein each of the resistance values is representative of a logic state. When the word read line is asserted, the voltage drop sustained across the via is indicative of the stored logic state. An analog-to-digital (A/D) converter is coupled to the data read line so as to sense the voltage drop and determine the state represented. Since the additional logic states may be used to represent additional information bits, this memory circuit increases the number of bits that may be stored per memory cell, thereby increasing the storage density and reducing the cost per bit.

Broadly speaking, the present invention contemplates a memory circuit comprising a via and an analog-to-digital converter. The via is coupled between a word read line and a data read line, and configured to sustain a voltage drop when the word read line is asserted. The analog-to-digital converter is coupled to the data read line to detect a value indicative of the voltage drop and convert it to one of at least three distinct digital values.

BRIEF DESCRIPTION OF THE DRAWINGS

Other objects and advantages of the invention will become apparent upon reading the following detailed description and upon reference to the accompanying drawings in which.

Figure 1:
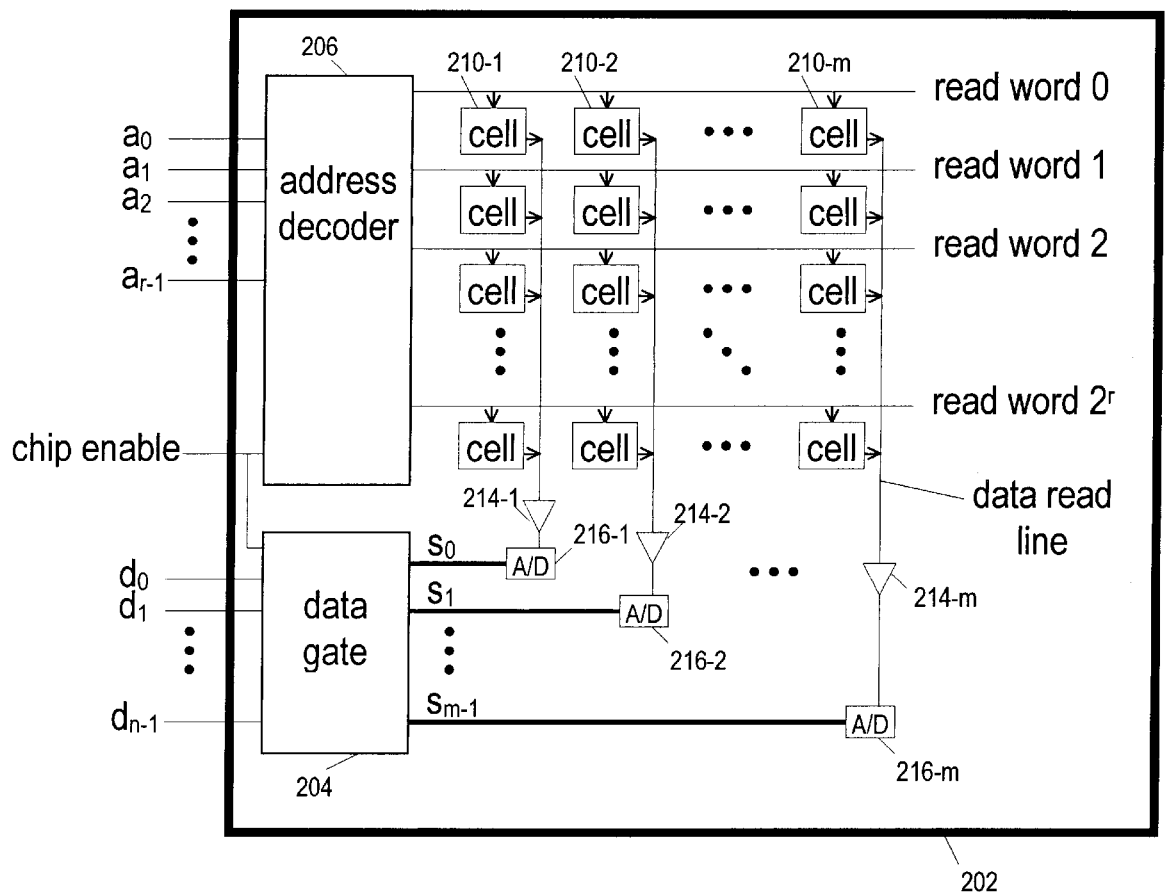
FIG. 1 is a block diagram of a semiconductor memory architecture capable of storing multiple level logic states according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 shows an exemplary memory architecture employed within computer system 100. In this embodiment, memory 200 has a ground plane 202 surrounding the chip circuitry which shields the circuitry from electromagnetic noise. Memory 200 receives a chip enable signal, and r address bit signals at an address decoder 206. During operation when the chip enable signal is asserted, address decoder 206 asserts one of $2^4$ read word lines. Each of the read word lines is coupled to a row of memory cells. When a read word line is asserted, the corresponding row of memory cells may be read.

Memory 200 also has n binary data lines ($D_0$–$D_{n-1}$) connected to a data gate 204. Data gate 204 is coupled to receive the enable signal and is further coupled to m data paths which carry multi-value logic signals ($S_0$–$S_{m-1}$). Each of the data paths can be driven by one of a set of analog-to-digital (A/D) converters 216-1 through 216-m (referred to collectively as A/D converters 216). Each column of memory cells is coupled by a data read line to one of a set of sense amplifiers 214-1 through 214-m, which in turn provides input to one of the A/D converters 216.

An exemplary memory read operation is now described. Consider a situation in which the address bits are all zero and the chip enable signal is asserted. Upon occurrence of this situation, address decoder 206 asserts the read word line for word 0 (i.e. "Read word 0"). This causes cells 210-1 through 210-m to pass a multi-level data signal indicative of information stored in the corresponding cells to the read data lines which are coupled to sense amplifiers 214. Sense amplifiers 214 detect and amplify the multi-level data signals and pass the amplified signals to A/D converters 216. A/D converters 216 convert the amplified signals to m multi-value logic signals ($S_0$–$S_{m-1}$) which are coupled to data gate 204. Data gate 204 converts the m multi-value logic signals ($S_0$–$S_{m-1}$) to n binary digital signals, and drives the n bits on data lines $D_0$–$D_{n-1}$. In this manner, a multi-value logic state stored in each cell may be read.

Figure 2:
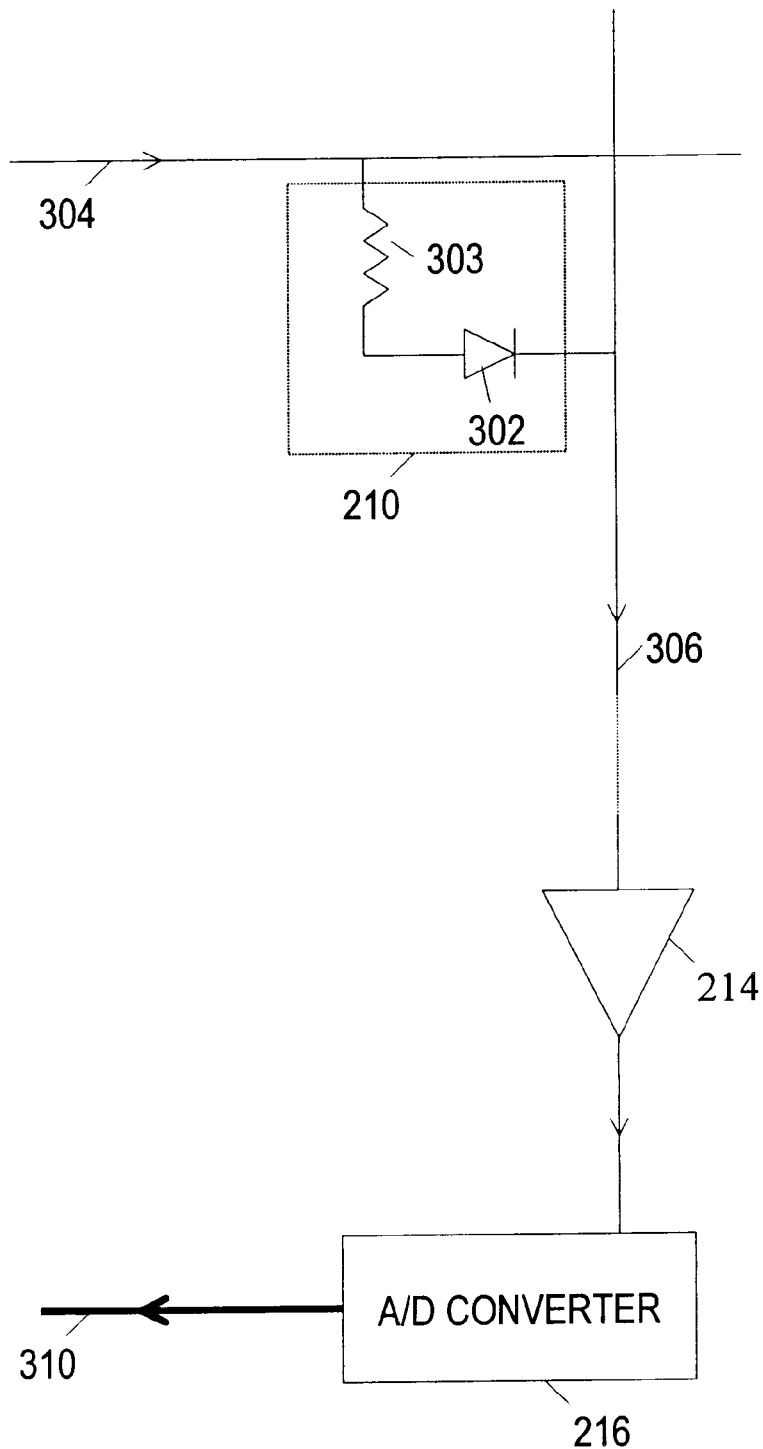
FIG. 2 is a block diagram illustrating the function of a memory cell and the read circuitry.

Turning now to FIG. 2, portions of memory circuit 200 are shown in greater detail. Circuit portions that correspond to those of FIG. 1 are numbered identically for simplicity and clarity. FIG. 2 illustrates a memory cell 210 which is exemplary of each of the cells of FIG. 1. Memory cell 210 includes a diode 302 coupled between a read word line 304 and a data read line 306. Diode 302 is coupled using a metal interconnection (hereafter, a via) 303 having a resistance. When word read line 304 is asserted, a current flows from read word line 304 through via 303 and diode 302 to data read line 306. The resistance of via 303 induces a voltage drop which is measured and amplified by sense amplifier 214. Sense amplifier 214 provides a signal indicative of the voltage drop to A/D converter 216. In order to sense the voltage drop, sense amplifier 214 draws current from data read line 306 by means of a finite resistance path to ground. A/D converter 216 converts the amplified signal into a multi-value logic signal which is one of $S_0$–$S_{m-1}$.

Figure 3:
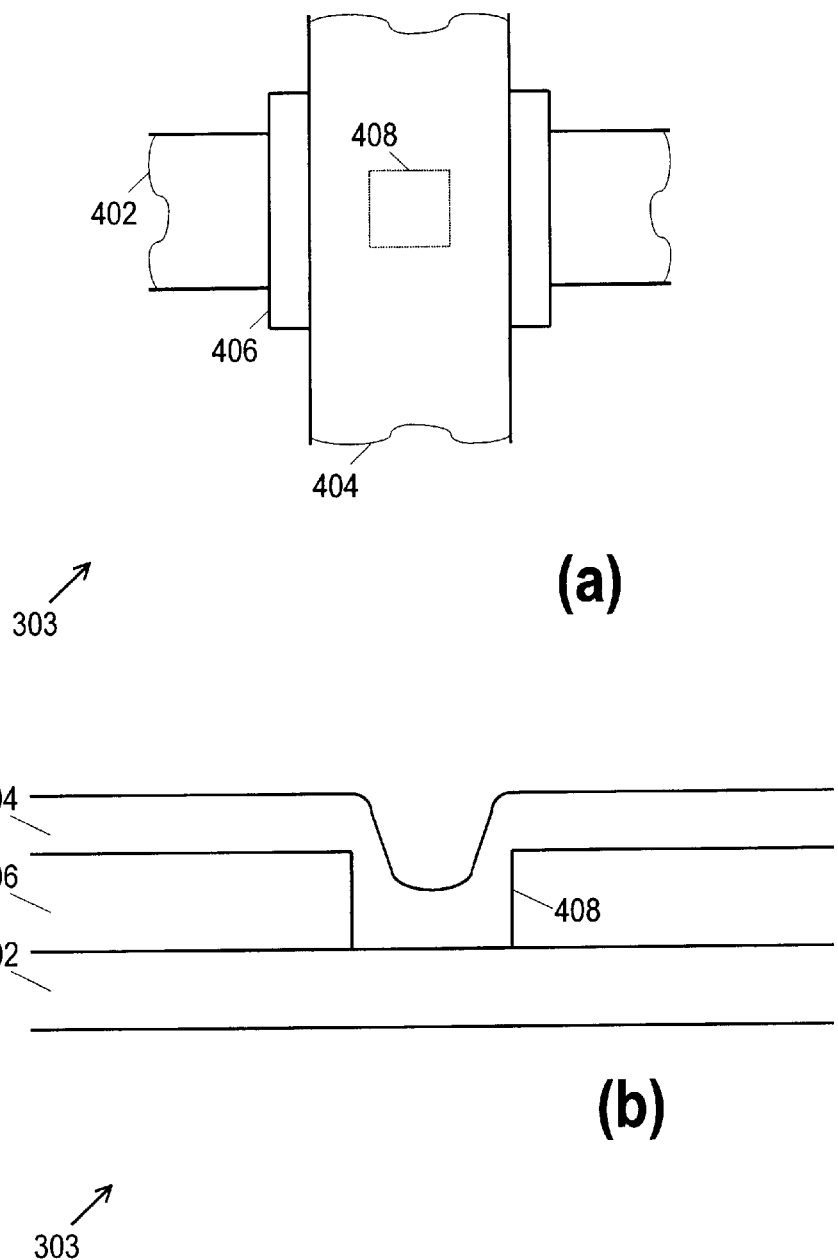
FIGS. 3a–3d are a view illustrating the structure of a via and methods for tailoring the resistance of the via.
Figure 3:
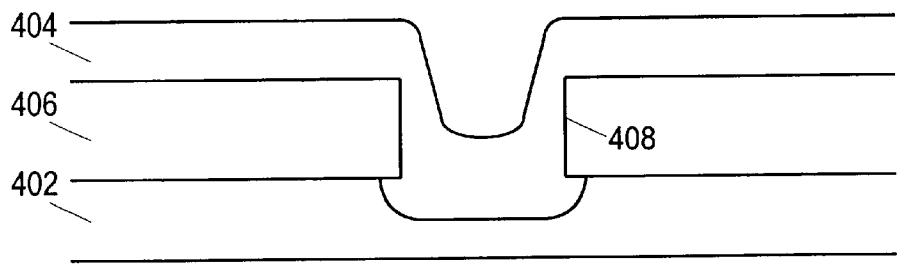
Figure 3:
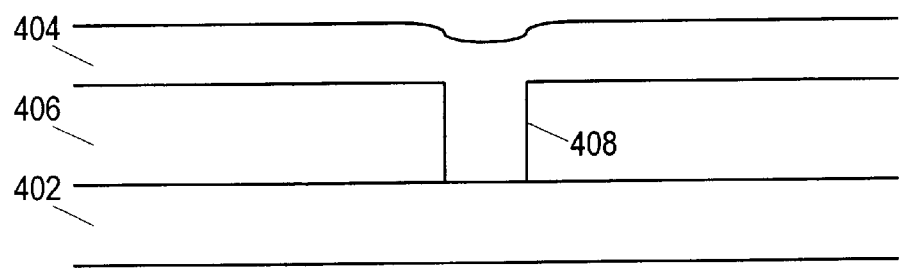

Turning now to FIG. 3, the structure of via 303 is further described. FIG. 3a shows a top view of a lower metal layer (or substrate contact) 402 which is separated from an upper metal layer 404 by an insulating dielectric 406 having an aperture 408. FIG. 3b shows a cross-sectional view of via 303. Current flowing through via 303 experiences a voltage drop which is caused primarily by a resistance at the interface between lower metal layer 402 and upper metal layer 404. This resistance can be tailored by altering the area of the interface. The resistance of the interface is inversely proportional to the area of the interface. For example, doubling the area of the interface halves the resistance.

The tailoring of via resistance can be done by altering the depth of the interface. In another embodiment, the size of the aperture can be changed or the number of apertures can be increased. FIG. 3c shows via 303 when the manufacturing process allows extra etch time for aperture 408 so that lower metal layer 402 is partially etched. It is noted that the area of the interface between lower metal layer 402 and upper metal layer 404 is increased relative to the interface in FIG. 3b. This increase in area results in a lower resistance and hence a lower voltage drop. FIG. 3d shows via 303 with a smaller aperture 408, which causes the interface between lower metal layer 402 and upper metal layer 404 to have a smaller area relative to FIG. 3b. This decrease in area results in a higher resistance and hence a larger voltage drop. The interface area may also be increased by having multiple instances of aperture 408 to connect lower metal layer 402 to upper metal layer 404. The tailoring of interface area may then be accomplished by filling in only those certain apertures needed to achieve the desired resistance.

Figure 4:
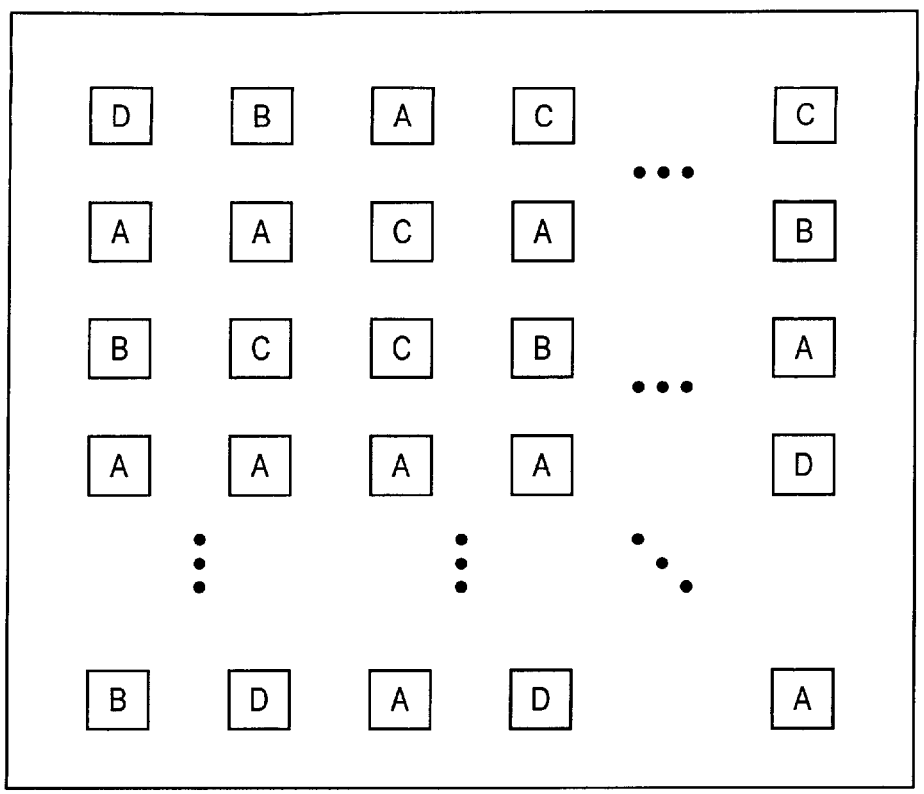
FIG. 4 is a conceptualized array of vias.

Turning now to FIG. 4, a conceptualized array 450 of vias is illustrated. For this array, four masks may be used to set different characteristics (and thereby different resistance values) for four sets of vias. In FIG. 4, the vias labeled A have an infinite (open circuit) resistance. The vias labeled B have a resistance value twice that of the input resistance of sense amplifier 214. The vias labeled C have a resistance value half that of the input resistance of sense amplifier 214. The vias labeled D have a negligible resistance value. In this manner, the voltage drops sustained by the vias are configured to substantially be V, 2V/3, V/3, and 0, respectively.

Figure 5:
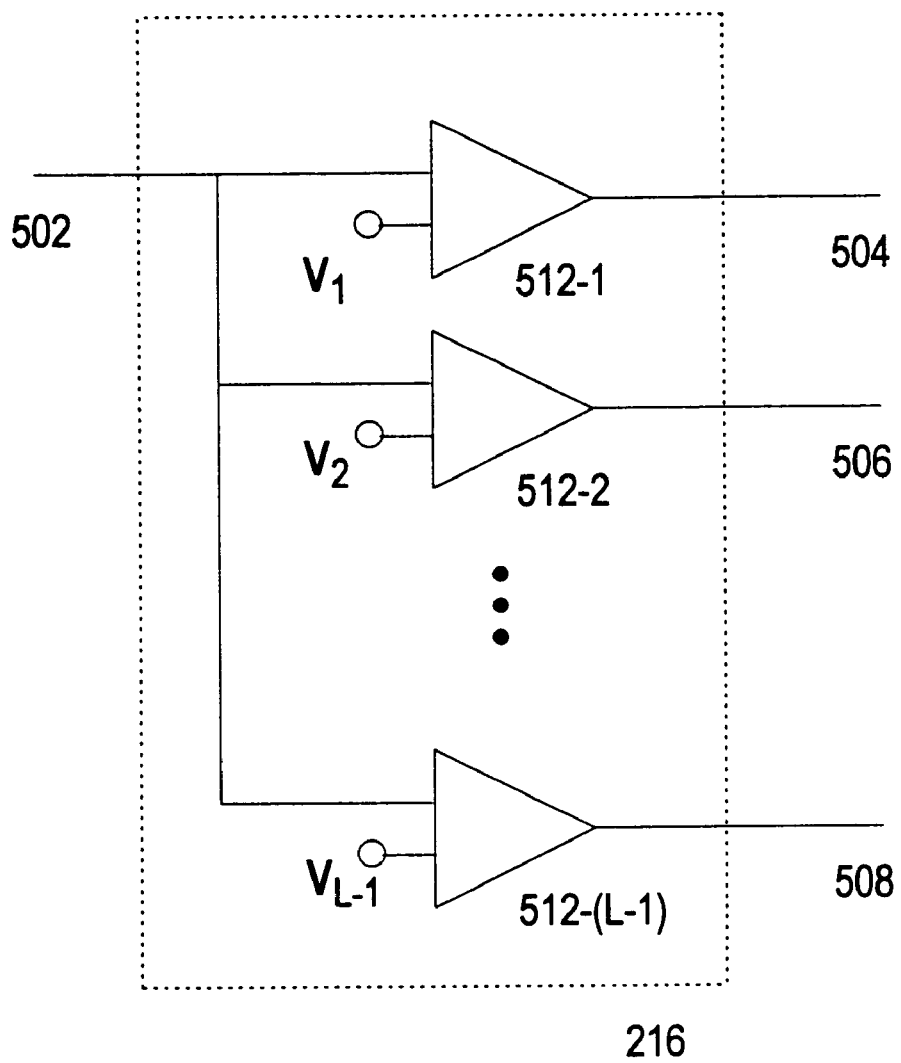
FIG. 5 is a block diagram of an analog to digital converter capable of sensing more than two stored signal states and converting them to digital form.

FIG. 5 shows a block diagram of one embodiment of A/D converter 216. A/D converter 216 receives an input signal 502 and drives a digital output signal on L-1 output lines 504–508 (which form a data path to carry one of the multi-value logic signals $S_0$–$S_{m-1}$). A/D converter 216 is comprised of L-1 comparators 512, where L is the number of logic states which can be stored in a memory cell 210. Each comparator receives one of L-1 reference voltages which demarcate the voltage regions representative of each logic state. For example, comparator 512-1 compares input signal 502 to reference voltage $V_1$, and asserts output line 504 when input signal 502 exceeds the reference voltage. The L-1 output lines accordingly have L possible states, ranging from having no lines asserted to having L-1 lines asserted.

Turning back to FIG. 1, with continued reference to FIG. 5, in one exemplary configuration of memory 200 wherein each memory cell stores one of four discrete states, memory 200 provides output on eight binary data lines $D_0$–$D_7$. The data for eight binary data lines can be represented by four quaternary logic signals. Each via 303 is manufactured to have one of four possible voltage drops when being read. Each of the four voltage drops induces one of four possible voltages at the output of one of the sense amplifiers 214. For example, the possible output voltages may be 0, V/3, 2V/3, and V, where V is the supply voltage. A/D converters 216 each include three output lines and three reference voltages which may be V/6, V/2, and 5V/6. Thus, if the output voltage of a particular cell 210 sensed by a sense amplifier 214 is 2V/3, two of the three output lines are asserted by A/D converter. Data gate 204 (when enabled) converts the four quaternary logic signals $S_0$–$S_3$ to output data on eight binary data lines $D_0$–$D_7$.

Numerous variations and modifications will become apparent to those skilled in the art once the above disclosure is fully appreciated. For example, the three approaches provided herein need not be used separately, but may be used in various combinations. It is intended that the following claims be interpreted to embrace all such variations and modifications.

What is claimed is:

1. A memory circuit comprising:
   an array of vias forming a memory structure wherein each of said vias is selectively sized to set an associated storage state, wherein differing vias forming said array have differing sizes, wherein said each of the vias is coupled between a word line and a read line, wherein said each of the vias is configured to sustain a voltage drop when the word read line is asserted;
   a diode coupled between the word read line and the data read line in series with said each of the vias, wherein the diode is configured to allow said each of the vias to sustain the voltage drop only when the word read line is asserted; and
   an analog-to-digital converter coupled to said array of vias and configured to detect a voltage across selected ones of said vias to thereby determine said associated storage state of each of said selected vias, wherein the analog-to-digital converter is further configured to detect a value indicative of the voltage drop.

2. The memory circuit of claim 1, wherein the via has a resistance which is set to determine the voltage drop, said resistance is set to one of at least three magnitudes.

3. The memory circuit of claim 1, wherein the via has a size which is set to determine the voltage drop.

4. The memory circuit of claim 1, wherein the via has a depth which is set to determine the voltage drop.

5. The memory circuit of claim 1, wherein the analog-to-digital converter comprises a plurality of comparators, wherein each of the plurality of comparators is coupled to compare the voltage drop to one of a plurality of reference voltages.

6. The memory circuit of claim 5, wherein the number of comparators equals the number of reference voltages, and wherein the number of reference voltages is equal to one less than a number of distinct digital values.

7. The memory circuit of claim 1, further comprising an address decoder configured to assert the word read line in response to receiving an address signal and an enable signal.

8. The memory circuit of claim 1, further comprising a data gate configured to convert m logic signals, each of the m logic signals having one of the distinct digital values, into n binary data bits during a read operation.

9. The memory circuit of claim 8, wherein the analog-to-digital converter is configured to provide the one of the distinct digital values to the data gate.

10. The memory circuit of claim 1, further comprising a sense amplifier coupled to detect the voltage drop, wherein the sense amplifier is configured to responsively provide the value to the analog-to-digital converter.

11. The memory circuit of claim 1, wherein the analog-to-digital converter is configured to convert the value to one of four distinct digital values.

12. The memory circuit of claim 1, wherein the analog-to-digital converter is configured to convert the value to one of sixteen distinct digital values.

13. A memory circuit comprising:
an array of vias forming a memory structure, wherein each of said vias is selectively sized to set an associated storage state, wherein the associated storage states include at least three states, wherein differing vias forming said array have differing sizes each corresponding to one of the at least three states, wherein said each of the vias is coupled between a word line and a read line, wherein said each of the vias is configured to sustain a voltage drop when the word read line is asserted; and
an analog-to-digital converter coupled to the array of vias and configured to detect a voltage across selected ones of said vias to thereby determine said associated storage state of each of said selected vias, wherein the analog-to-digital converter is further configured to detect a value indicative of the voltage drop;
wherein said each of the vias has a size which is set to determine the voltage drop.

14. The memory circuit of claim 13, wherein the memory circuit further comprises a diode coupled between the word read line and the data read line in series with said each of the vias, wherein the diode is configured to allow said each of the vias to sustain the voltage drop only when the word read line is asserted.

15. The memory circuit of claim 13, wherein the via has a depth which is set to determine the voltage drop.

16. The memory circuit of claim 13, wherein the analog-to-digital converter comprises a plurality of comparators, wherein each of the plurality of comparators is coupled to compare the voltage drop to one of a plurality of reference voltages.

17. The memory circuit of claim 13, further comprising a sense amplifier coupled to detect the voltage drop, wherein the sense amplifier is configured to responsively provide the value to the analog-to-digital converter.

18. A memory circuit comprising:
an array of vias forming a memory structure wherein each of said vias is selectively sized to set an associated storage state, wherein differing vias forming said array have differing sizes, wherein said each of the vias is coupled between a word line and a read line, wherein said each of the vias is configured to sustain a voltage drop when the word read line is asserted; and
an analog-to-digital converter coupled to said array of vias and configured to detect a voltage across selected ones of said vias to thereby determine said associated storage state of each of said selected vias, wherein the analog-to-digital converter is further configured to detect a value indicative of the voltage drop;
wherein said each of the vias has a resistance which is set to determine the voltage drop, and wherein said resistance is set to one of at least three magnitudes.

19. A memory circuit comprising:
an array of vias forming a memory structure, wherein each of said vias is selectively sized to set an associated storage state, wherein the associated storage states include at least three states, wherein differing vias forming said array have differing sizes each corresponding to one of the at least three states, wherein said each of the vias is coupled between a word line and a read line, wherein said each of the vias is configured to sustain a voltage drop when the word read line is asserted;
a diode coupled between the word read line and the data read line in series with said each of the vias, wherein the diode is configured to allow said each of the vias to sustain the voltage drop only when the word read line is asserted; and
an analog-to-digital converter coupled to the array of vias and configured to detect a voltage across selected ones of said vias to thereby determine said associated storage state of each of said selected vias, wherein the analog-to-digital converter is further configured to detect a value indicative of the voltage drop.

* * * * *